US007602240B2

(12) United States Patent
Gao et al.

(10) Patent No.: US 7,602,240 B2
(45) Date of Patent: Oct. 13, 2009

(54) POWER AMPLIFIER WITH AN OUTPUT MATCHING NETWORK

(75) Inventors: Huai Gao, Morgan Hill, CA (US); Haitao Zhang, Nashua, NH (US); Guann-Pyng Li, Irvine, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 11/911,800

(22) PCT Filed: Apr. 28, 2006

(86) PCT No.: PCT/US2006/016405

§ 371 (c)(1),
(2), (4) Date: Oct. 17, 2007

(87) PCT Pub. No.: WO2006/121650

PCT Pub. Date: Nov. 16, 2006

(65) Prior Publication Data

US 2008/0180178 A1    Jul. 31, 2008

(51) Int. Cl.
*H03F 1/24* (2006.01)

(52) U.S. Cl. .......................... 330/98; 330/302; 330/310

(58) Field of Classification Search .................. 330/98, 330/150, 302, 310
See application file for complete search history.

(56) References Cited

U.S. PATENT DOCUMENTS

| | | | |
|---|---|---|---|
| 4,559,503 A | * | 12/1985 | Camand et al. ............. 330/302 |
| 5,726,606 A | * | 3/1998 | Marland ..................... 330/302 |
| 6,232,841 B1 | | 5/2001 | Bartlett et al. |
| 6,300,827 B1 | * | 10/2001 | King ........................... 330/65 |
| 6,310,517 B1 | * | 10/2001 | Nakahara et al. ............ 330/277 |
| 6,501,335 B2 | * | 12/2002 | Kakuta et al. ............... 330/302 |

OTHER PUBLICATIONS

A.C. Colter and E.R. Brown, The feasibility of a variable output matching circuit in a high-power SSPA, IEEE, 2002, pp. 189-191, Dept. of Electrical Engineering, University of California, Los Angeles.

Haitao Zhang et al, A novel tunable broadband power amplifier module operating from 0.8 GHz to 2.0 GHz, IEEE, 2005, pp. 661-664, Electrical Engineering & Computer Science, Integrated Nanosystems Research Facility, University of California, Irvine.

Seungwoo Kim et al, CDMA handset power amplifier with a switched output matching circuit for low/high power mode operations, IEEE MTT-S Digest, 2004, pp. 1523-1526, Dept. of Electronic and Electrical Engineering and Microwave Application Research Center, Pohang University of Science and Technology, Kyoungbuk, Korea.

* cited by examiner

*Primary Examiner*—Henry K Choe
(74) *Attorney, Agent, or Firm*—Orrick, Herrington & Sutcliffe LLP (57) ABSTRACT

Provided herein is a power amplifier having a multiple stage power amplifier section and an output matching network section. The multiple stage power amplifier section can include multiple power amplifier stages with interstage matching circuits located therebetween. The output matching network can be configured to match the multiple stage power amplifier section at multiple different frequencies or frequency bands. The power amplifier device is capable of selective operation within one of multiple different frequencies or frequency bands.

14 Claims, 10 Drawing Sheets

POWER AMPLIFIER WITH AN OUTPUT MATCHING NETWORK

RELATED FIELD

The present invention relates to power amplifiers for wireless communication systems.

BACKGROUND INFORMATION

For decades, the realization of broadband, high power monolithic microwave integrated circuit (MMIC) power amplifiers has posed a significant challenge to microwave design and systems engineers, mainly due to limitations imposed by the electrical and thermal properties of GaAs transistor technology. Recently, broadband power amplifier modules consisting of MMIC power amplifiers, matching networks, and control circuits have emerged to meet the demand of power amplification with multi-frequency band coverage. One such design is the single module implementation created by integrating multiple MMIC narrow band power amplifier chips with corresponding matching circuits, controlled by switches for frequency band tuning. However, such an implementation requires multiple MMIC chips, makes the biasing circuit more complicated and fails to decrease the number of components used in the matching circuits.

In order to simplify the design of broadband power amplifier modules, alternative circuit topologies have been proposed. These include, for example, balanced amplifiers, distributed amplifiers, feedback amplifiers, and amplifiers with variety of matching networks. However, each circuit topology and/or matching network has associated advantages and disadvantages that must be considered depending on the particular application.

While a balanced amplifier is a good candidate to meet broadband requirements, the quarter wavelength sizing of the couplers is usually not practical in MMIC's—especially at the low gigahertz frequency range used in conventional wireless handset communications. Distributed amplifiers, on the other hand, can obtain a broad bandwidth and facilitate load matching, but suffer from low gain, low efficiency, and a relatively large chip size. Feedback amplifiers designed as broadband amplifiers have a relatively small chip size, their gain is low at microwave frequencies and their efficiency is compromised when resistive feedback is used. Alternatively, traditional amplifiers (e.g., common source and common emitter topologies) with lossy matching networks can be used to trade off the power gain for better gain flatness over a wider frequency range. On the other hand, in a low-loss matching design, synthesizing the components with realistic values within a broad frequency band is extremely difficult.

Since the output matching network plays a definite role in determining the performance of power amplifiers, such as power gain, power added efficiency (PAE), bandwidth and linearity, a great deal of design effort has been focused on its implementation with the aforementioned MMIC power amplifiers circuit topologies. In order to make the output matching network reconfigurable for various operating frequencies, the network is often made off-chip with tunable components. Not only can the PAE of the broadband power amplifiers be improved by tuning the components value in the output matching network as illustrated in S. Kim, J. Lee, J. Shin, B. Kim, "CDMA handset power amplifier with a switched output matching circuit for low/high power mode operations," in *IEEE MTT-S Int. Microwave Symp. Dig.*, vol. 3, Jun. 2004, pp. 1523-1526, A. C. Cotler, E. R. Brown, "The feasibility of a variable output matching circuit in a high-power SSPA," in *IEEE Radio and Wireless Conference*, August 2002, pp. 189-191, and J. J. Yao, C. W. Seabury, D. R. Pehlke, J. L. Bartlett, J. L. Julian, M. C. F. Chang, H. O. Marcy, K. D. Pedrotti, D. Mehrotra, "Integrated tunable high efficiency power amplifier," U.S. Pat. No. 6,232,841, May 15, 2001, but also broadband matching can be realized by using two output matching routes. Furthermore, harmonic tuning through the use of photonic band-gap (PBG) and defected ground structure (DGS) at the output of the power amplifier have been proposed recently for broadband matching as well. However, these designs will suffer from low PAE, power gain or large chip size in typical broadband power amplifiers.

Thus, broadband amplifiers capable of overcoming the disadvantages of previous designs are needed.

SUMMARY

This section describes exemplary embodiments of the power amplifier with an output matching network. These embodiments are only a few examples of the many possible implementations and are in no way intended to limit the subject matter of the present description.

In one exemplary embodiment, a power amplifier device is configured for broadband operation and includes a multiple stage power amplifier section including an input stage coupled with at least one subsequent stage, one of the at least one of the subsequent stages being an output stage. The input stage can include a transistor having a base node, a collector node, which can be coupled with a subsequent stage of the power amplifier, and an emitter node. The input stage can also include a first feedback path coupled with the emitter node and a second feedback path coupled between the base node and the collector node. The second feedback path can include a resistive element and a capacitive element. The input stage can also include an input node coupled with the base node, the input node for receiving an input signal to the multiple stage power amplifier. The power amplifier device preferably also includes an output matching network section coupled with the output stage of the power amplifier.

In another exemplary embodiment, the multiple stage power amplifier section can include the input stage coupled with a first subsequent stage, the first subsequent stage being coupled with a second subsequent stage, wherein the second subsequent stage is the output stage. In another exemplary embodiment, the multiple stage power amplifier section can include the input stage coupled directly with the output stage.

In another exemplary embodiment, the power amplifier device can include an interstage matching circuit coupled between at least two adjacent stages of the multiple stage power amplifier section. The interstage matching circuit and/or the output matching network section can each be configured as one of a low pass filter or a high pass filter.

In another exemplary embodiment, the power amplifier device can be configured for selective operation at one frequency range out of a plurality of frequency ranges. The output matching network section can include a control input configured to receive a frequency range selection signal. The control input can be coupled to a switch controllable by the frequency range selection signal. In yet another exemplary embodiment, the switch can be a PIN diode.

In another exemplary embodiment, the power amplifier device can be configured for narrowband operation.

In another exemplary embodiment, one or more active devices within the multiple stage power amplifer section can include an interdigital capacitor with a first plate having an upper portion and a lower portion and a second plate located between the upper portion and lower portion of the first plate. In yet another exemplary embodiment, the lower portion of the first plate can be located in a first conductive layer of the power amplifier device, the second plate can be located in a second conductive layer of the power amplifier device overlying the first conductive layer, and the upper portion of the first plate can be located in a third conductive layer of the power amplifier device overlying the second conductive layer.

With the present broadband power amplifier module, the total chip area is decreased, the chip count and components count in the module is less than others, the module size and weight is less than others, the cost of the module is less than others, and the efficiency and linearity is better than others.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims. As mentioned above, it is also intended that the invention not be limited to the details of the example embodiments.

BRIEF DESCRIPTION OF THE FIGURES

The details of the invention, including fabrication, structure and operation, may be gleaned in part by study of the accompanying figures, in which like reference numerals refer to like parts. The components in the figures are not necessarily to scale, emphasis instead being placed upon illustrating the principles of the invention. Moreover, all illustrations are intended to convey concepts, where relative sizes, shapes and other detailed attributes may be illustrated schematically rather than literally or precisely.

DETAILED DESCRIPTION

Figure 1:
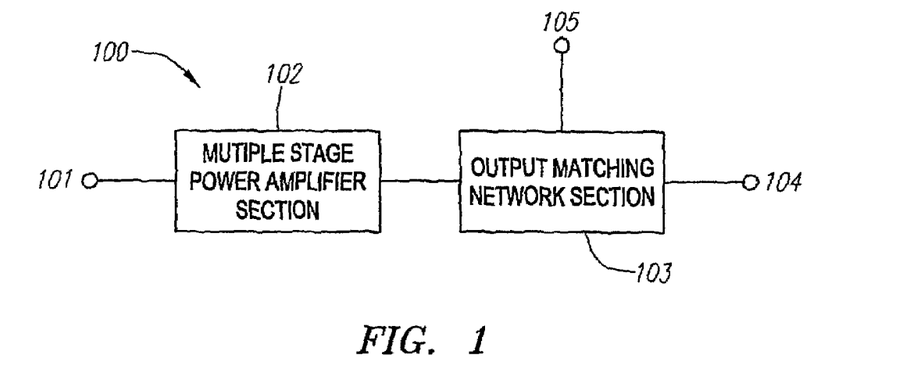
FIG. 1 is a block diagram depicting an exemplary embodiment of a power amplifier device.

FIG. 1 is a block diagram depicting an exemplary embodiment of an improved power amplifer (PA) device 100. PA device 100 can be configured for broadband or narrowband operation within any of a number of frequency ranges. The components of PA device 100 can be fabricated in any manner desired, including but not limited to monolithic fabrication on a single semiconductor chip (e.g., a MMIC), fabrication on multiple separate semiconductor chips, or distributed fabrication on one or more semiconductor chips and integrated with components located on a substrate, such as a printed circuit board (PCB) and the like. Each method of fabrication has it's own set of advantages which change over time. For instance, distributed implementation can allow the user to take advantage of the power amplification characteristics of certain semiconductor processes while still using high-Q ceramic components on the module substrate.

Here, PA device 100 includes an input node 101, a multiple stage power amplifier section 102, an output matching network section 103 and an output node 104. Output matching network section 103 can include one or more control inputs 105 for controlling the operating frequency band for device 100.

Multiple stage (multi-stage) power amplifier (PA) section 102 is preferably configured to amplify the power of an input signal fed into input node 101, while output matching network section 103 is preferably configured to provide reconfigurable output matching to multi-stage PA section 102 to satisfy the impedance transformation ratio requirements at various operating frequencies. Together, sections 102 and 103 can provide for improved power amplification within a selectable frequency range. PA device 100 can be configured to operate at specific desired frequencies relied on by a wide range of different wireless communication environments. Some examples include, but are not limited to, GSM, DCS, PCS, CDMA, WCDMA, WLAN and the like.

Figure 2A:
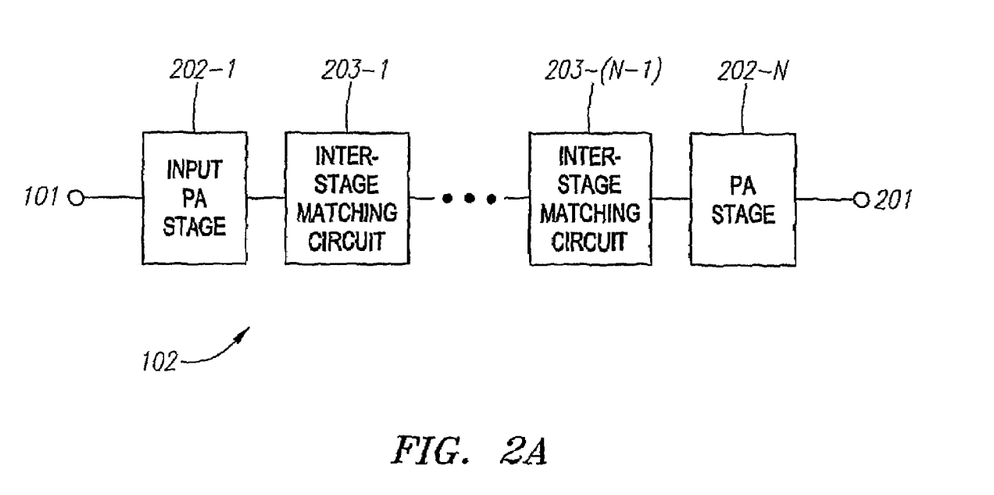
FIG. 2A is a block diagram depicting an exemplary embodiment of a multiple stage power amplifier section.

FIG. 2A is a block diagram depicting an exemplary embodiment of multi-stage PA section 102 having an input stage 202-1 and N subsequent PA stages (i.e., section 102 includes PA stages 202-1 through 202-N). N can be any number greater than or equal to two. Interstage matching circuits 203-1 through 203-(N−1) can be provided between PA stages 202 (note that in the case where N=2, only one interstage matching circuit 203-1 is preferably used). Input node 101 is connected to input stage 202-1 (input matching circuitry is preferably included between node 101 and input stage 202-1) and PA section output node 201 is preferably coupled to the output PA stage 202-N.

In one exemplary embodiment, input stage 202-1 can be configured to perform a pre-distortion function that can compensate for the gain losses of subsequent stages when operating at relatively high power levels. The pre-distortion function is described in more detail below. Output stage 202-N can be configured to provide sufficient output power for the application. If one or more intermediate stages are implemented between input stage 202-1 and output stage 202-N, these intermediate stages 202 can be configured to increase the overall gain of PA device 100.

Figure 2B:
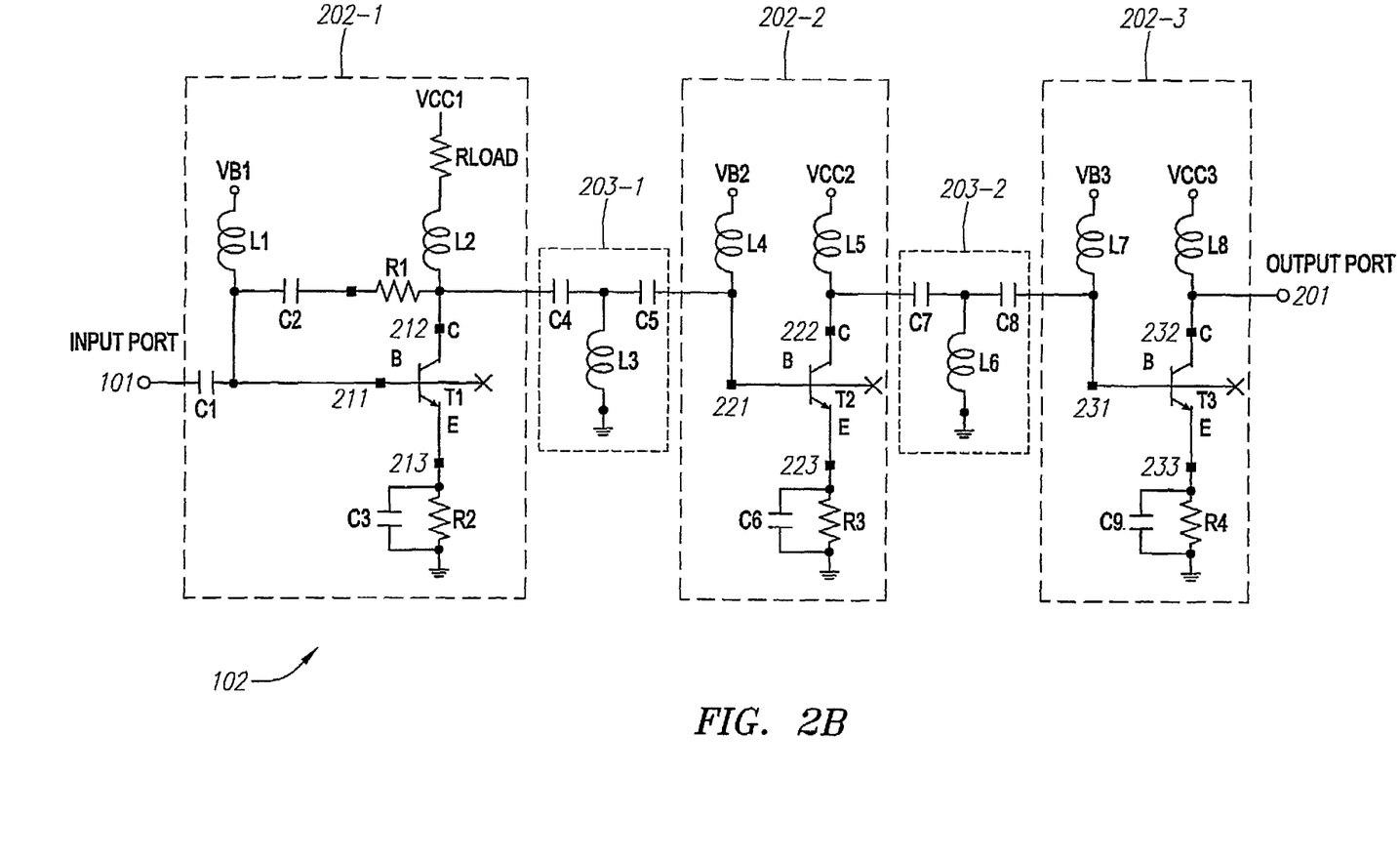
FIG. 2B is a schematic diagram depicting another exemplary embodiment of a multiple stage power amplifier section.

FIG. 2B is a schematic diagram depicting another exemplary embodiment of multi-stage PA section 102. Here, in order to achieve a high gain (e.g., in one example, approximately 30 dB) at full output power levels, multi-stage PA section 102 includes three PA stages 202-1 through 202-3 and two interstage matching circuits 203-1 and 203-2. Each of PA stages 202-1 through 202-3 includes an active device Ti through T3, respectively. Active devices T1 through T3 can be any active device or combination of devices capable of amplifying an input signal. In this embodiment, each of active devices T1 through T3 is a heterojunction bipolar transistor (HBT).

Input node 101 is coupled with the first stage, which is the input stage 202-1. Input stage 202-1 includes the already mentioned active device Ti, which has a base node 211, a collector node 212 and an emitter node 213. In this embodiment, input stage 202-1 is configured with active device T1 as a common emitter. Input stage 202-1 also includes two inductors L1 and L2, three capacitors C1, C2 and C3, and two resistors R1 and R2. Capacitor C1 is coupled between input node 101 and base node 211. Inductor L1 is coupled between base node 211 and a first DC power supply, VB1. Capacitor C2 and resistor R1 are coupled in series between base node 211 and collector node 212. Inductor L2 is coupled between collector node 212 and a second DC power supply, VCC1. Resistor R2 and capacitor C3 are coupled in parallel between emitter node 213 and a reference node, which in this embodiment is ground.

Second PA stage 202-2 includes the already mentioned active device T2, which has a base node 221, a collector node 222 and an emitter node 223. In this embodiment, second stage 202-2 is configured with active device T2 as a common emitter. Base node 221 is coupled with collector node 212 of input stage 202-1 by way of interstage matching circuit 203-1. Interstage matching circuit 203-1 includes two capacitors, C4 and C5, and an inductor L3 coupled between capacitors C4 and C5 and ground. In addition to active device T2, second stage 202-2 includes two inductors L4 and L5, a resistor R3 and a capacitor C6. Inductor L4 is coupled between base node 221 and a third DC power supply, VB2. Inductor L5 is coupled between collector node 222 and a fourth DC power supply, VCC2. Resistor R3 and capacitor C6 are coupled in parallel between emitter node 223 and ground.

Third PA stage 202-3, which is also the output stage for PA section 102, includes the already mentioned active device T3, which has a base node 231, a collector node 232 and an emitter node 233. In this embodiment, output stage 202-3 is configured with active device T3 as a common emitter. Base node 231 is coupled with collector node 222 of second stage 202-2 by way of interstage matching circuit 203-2. Interstage matching circuit 203-2 includes two capacitors, C7 and C8, and an inductor L6 coupled between capacitors C7 and C8 and ground. In addition to active device T3, output stage 202-3 includes two inductors L7 and L8, a resistor R4 and a capacitor C9. Inductor L7 is coupled between base node 231 and a fifth DC power supply, VB3. Inductor L8 is coupled between collector node 232 and a sixth DC power supply, VCC3. Resistor R4 and capacitor C9 are coupled in parallel between emitter node 233 and ground.

In another exemplary embodiment, any or all of capacitor/resistor combinations C3/R2, C6/R3, and C9/R4 can be eliminated and replaced with a connection direct to ground or an inductor. In other embodiments, input stage 202-1 can be replaced with one of the circuits depicted in FIGS. 2C-E. Each of the circuits in FIGS. 2C-E are preferably used in applications that serve a relatively more narrow band of operating frequencies, i.e., narrowband operation, as opposed to the broadband operation provided by input stage 202-1 described with respect to FIG. 2B.

Figure 2C:
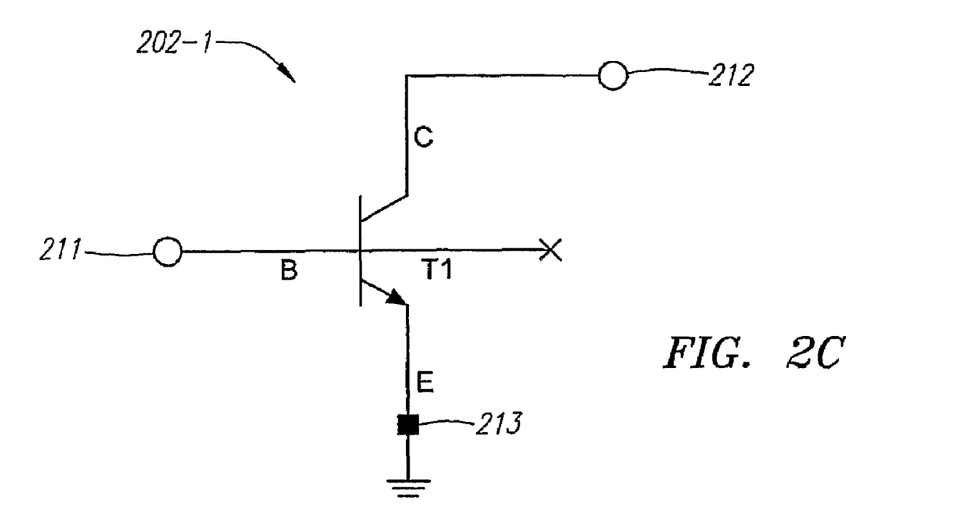
FIGS. 2C-F are schematic diagrams depicting exemplary embodiments of the first stage of a multiple stage power amplifier section.
Figure 2D:
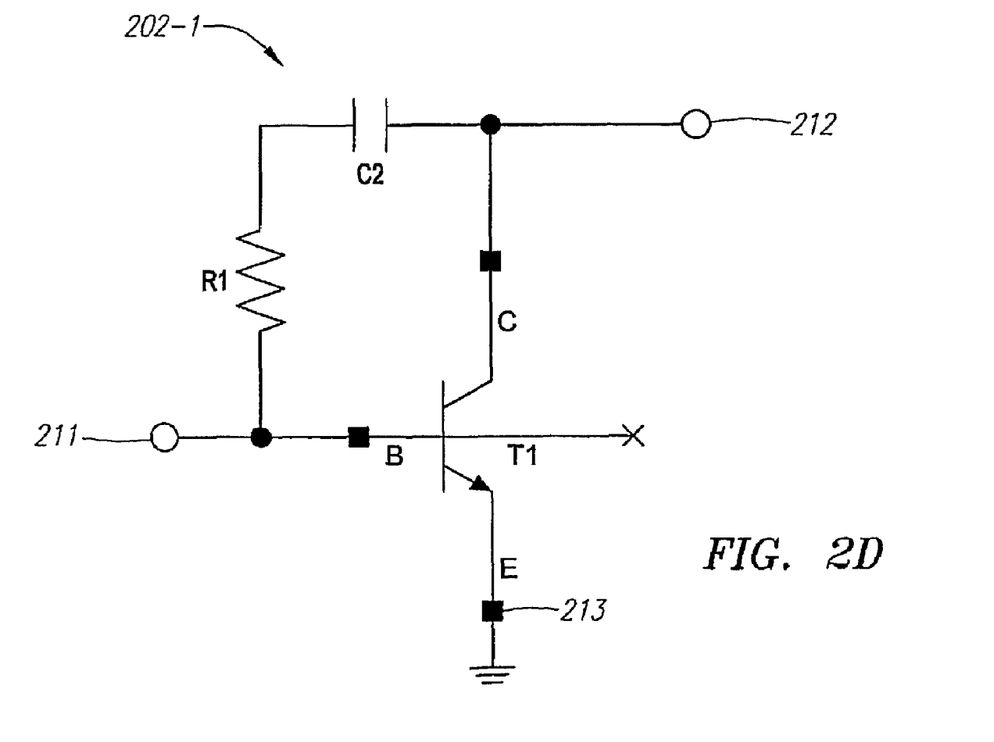
Figure 2E:
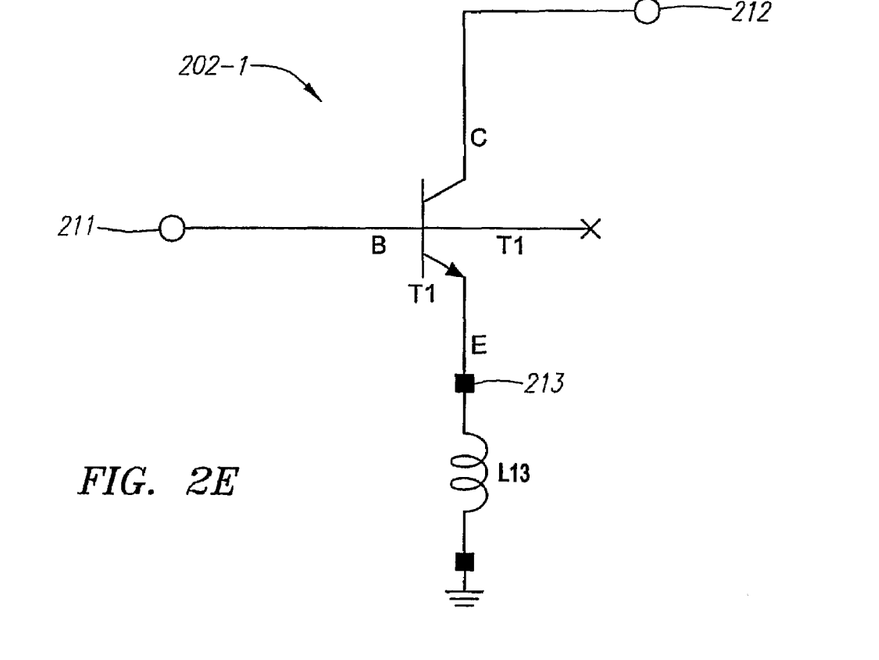
Figure 2F:
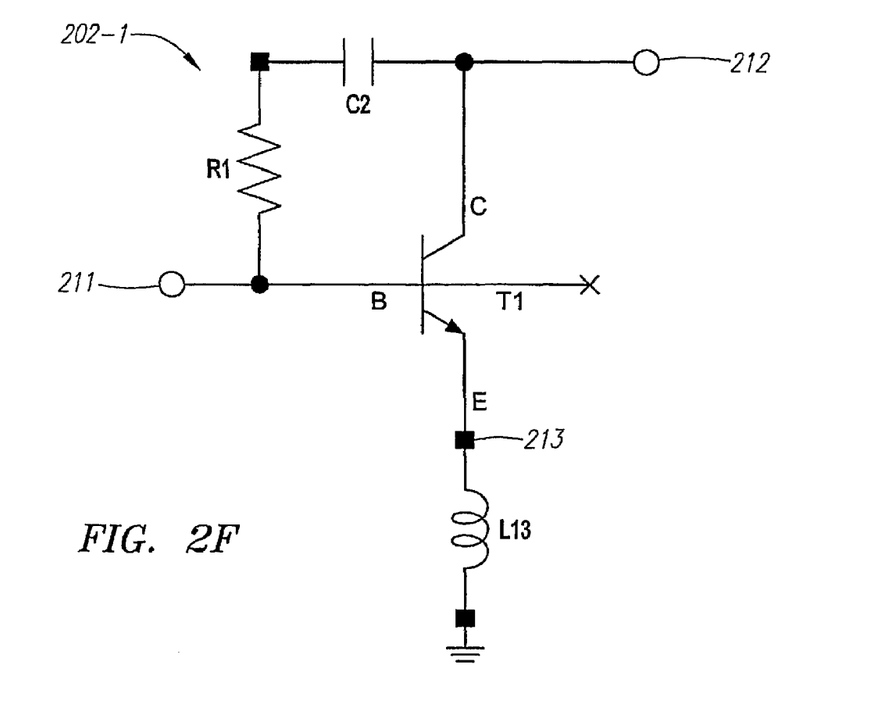

FIG. 2C depicts an embodiment where active device T1 is used alone, FIG. 2D depicts an embodiment where active device T1 is used with an RC shunt feedback path provided by the series connection of resistor R1 and capacitor C2 between base node 211 and collector node 212. FIG. 2E depicts an exemplary embodiment where active device T1 is used with an L series feedback path provided by the connection of inductor L13 between collector node 213 and ground. FIG. 2F depicts another exemplary embodiment of input stage 202-1 configured for broadband operation, where active device T1 is used with both the RC shunt feedback provided by capacitor C2 and resistor R1 and the L series feedback path provided by inductor L13.

PA device 100 can be implemented in a host of different process technology configurations including, but not limited to, gallium arsenide (GaAs) HBTs, silicon germanium (SiGe) HBTs, indium phosphide (InP) HBTs, indium gallium phosphide (InGaP) HBTs, aluminum gallium arsenide/gallium arsenide (AlGaAs/GaAs) HBTs, indium gallium phosphide/gallium arsenide (InGaP/GaAs) HBTs, GaAs field effect transistors (FETs), InP FETs, silicon (Si) FETs, Si bipolar junction transistors (BJTs) and the like. In the embodiment described with respect to FIG. 2B, PA device 100 is preferably fabricated in an AlGaAs/GaAs or InGaP/GaAs process.

The power gain is preferably distributed carefully among PA stages 202-1 through 202-3 to improve the overall broadband power amplifier performance. The power gain of input stage 202-1 can be compressed to achieve relatively improved linearity. Second PA stage 202-2 can be configured to operate with a high power gain and with a reasonable linearity, since this stage 202-2 is followed by the additional gain of output stage 202-3. To achieve relatively improves linearity, both input stage 202-1 and second stage 202-2 preferably operate in Class A mode. In this embodiment, output stage 202-3 is typically the stage that influences overall PA efficiency to the greatest degree and, accordingly, output stage 202-3 is operated in Class AB mode. This provides relatively improved efficiency. Output matching network section 103 can then be configured to obtain the maximum power and efficiency. It should be noted that the DC biasing circuits for each stage 202-1 through 202-3, which in this embodiment are the RF choke circuits including inductors L1, L2, L4, L5, L7, and L8, can be independently controlled to increase the flexibility in operating power amplifier device 100.

Referring back to the configuration of input stage 202-1, the design of this stage significantly affects the performance of the entire power amplifier device 100. Input stage 202-1 is configured as a common emitter with RC shunt feedback (capacitor C2 and resistor R1) and $R_E$ C series feedback (capacitor C3 and resistor R2) paths. This configuration can provide broadband matching at input node 101 and collector output node 212. This configuration also can improve circuit and thermal stability.

It is well known that owing to transistor nonlinearity, the output power gain of the output stage of a conventional multi-stage power amplifier decreases as the input power increases, resulting in the typical gain compression found in these conventional PAs. In the embodiment of FIG. 2B, input stage 202-1 can be configured with an added pre-distortion function to compensate for the gain loss of output stage 202-3 when operating at high power levels. In this embodiment, the added pre-distortion function is realized through the use of a load resistor $R_{LOAD}$ in series with inductor L2 to adjust the biasing condition of active device T1 within input stage 202-1.

As the input power increases, the initial biasing point of active device T1 is typically pushed from the saturation region in the direction of the region having low output current and high output voltage. See U.S. Pat. No. 6,377,118, entitled "*Linearizer for power amplifier*," issued Apr. 23, 2002, which is fully incorporated by reference herein, for more discussion on this topic. Under such a biasing arrangement, the power gain will increase under the large input power, but the power gain will remain generally constant under small input power levels. Consequently, the P1dB of power amplifier device 100 will increase accordingly. To properly design input stage 202-1 with a desirable and controllable pre-distortion function, a nonlinear circuit model at large signal conditions for active device T1 is preferably used.

Figure 3:
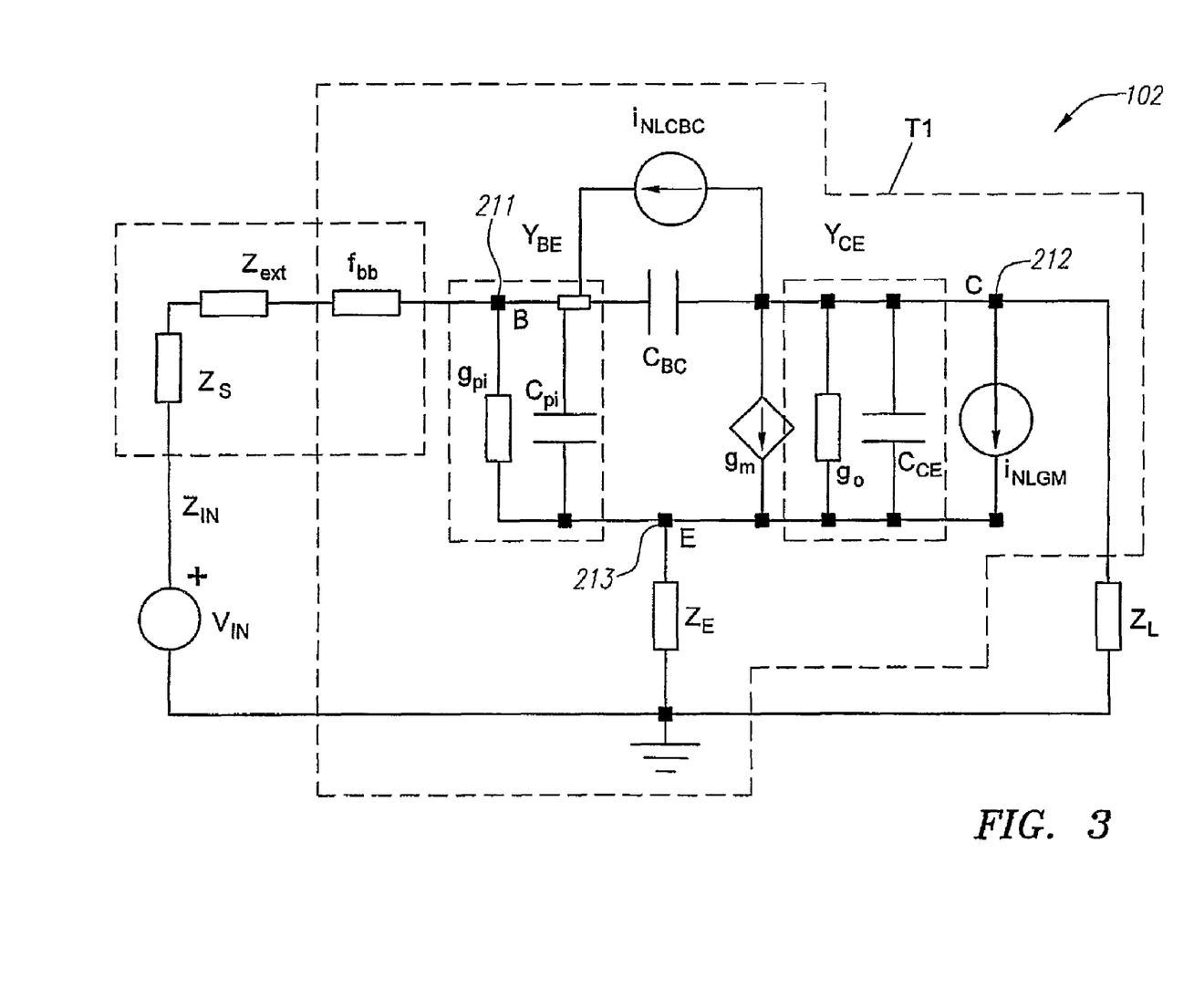
FIG. 3 is a block diagram of an exemplary equivalent circuit of an exemplary embodiment of an active device used within the first stage of a multiple stage power amplifier section.

If desired, a Volterra series analysis is one exemplary technique that can be performed to determine the nonlinear effect of active device T1 within input stage 202-1. FIG. 3 is a block diagram depicting an exemplary equivalent circuit of a portion of PA section 102 including active device T1 implemented as an HBT within input stage 202-1. Here, voltage source $V_{IN}$, and impedance blocks $Z_S$, $Z_{ext}$ and $Z_L$ are external to active device T1.

Many common BJT/HBT Volterra series analyses consider the collector current as only a function of base voltage and assume that the output conductance remains constant. In an embodiment fabricated with InGaP/GaAs HBTs, the base doping level ($4 \times 10^{19}$ cm$^{-3}$) is relatively much higher than the doping level within the sub-collector region ($1 \times 10^{16}$ cm$^{-3}$) and the early effect is insignificant and can be neglected in the Volterra series analysis. A third-degree Taylor expansion of IC_VBE can be written as:

$$i_c = g_m v_{be} + K_{2GM} v_{be}^2 + K_{3GM} v_{be}^3 \tag{1}$$

where $g_m$, $K_{2GM}$ and $K_{3GM}$ are polynomial coefficients for the transconductance. Since the nonlinear function of IC_VCE can be neglected as discussed before, equation (1) does not have the polynomial coefficients for $v_{ce}$.

In HBTs, the IB_VBE nonlinearity caused by exponential $g_{pi}$ is preferably considered. In theory, the IB-VBE equation should be roughly the collector current divided by the current gain, but some simplifications can be made. Since the base current generally does not depend strongly on the collector voltage, a two-dimensional model of $v_{be}$ can be used, giving:

$$i_b = g_{pi} v_{be} + K_{2GPI} v_{be}^2 + K_{3GPI} v_{be}^3 \tag{2}$$

Here, the coefficients have similar definitions as before. The linear term is modeled by $g_{pi}$, and $K_{2GPI}$ and $K_{3GPI}$ model the exponential curvature.

To model the capacitances, the charges at each node are first extracted and then differentiated with respect to the nodal voltage. The extracted charge differentiated with respect to time determines the displacement current, and thus the nonlinear current source. Equations (3) below represents the base-to-emitter charge as functions of base-to-emitter voltage and base-to-collector charge as functions of base-to-collector voltage:

$$Q_{be} = C_{pi} v_{be} + K_{2CPi} v_{be}^2 + K_{3CPi} v_{be}^3$$

$$Q_{bc} = C_{BC} v_{bc} + K_{2CBC} v_{bc}^2 + K_{3CBC} v_{bc}^3 \tag{3}$$

As seen from the equations (3), a linear C-V term is represented by $C_{pi}$ and $C_{bc}$ and the terms of $K_{2CPI}$ and $K_{2CBC}$ cause quadratic charge nonlinearity. Similarly, a capacitance proportional to $v^2$ ($K_{3CPI}$ and $K_{3CBC}$) causes cubic nonlinearity.

When an InGaP/GaAs HBT technology is used, equations (3) can be further simplified. Since the base region of an InGaP/GaAs HBT is heavily doped and since the thickness of the emitter region can be only tens of nanometers, the emitter layer of the HBT used in the first stage is always depleted even under large signal swing conditions. As a result, the nonlinearity coming from the $C_{pi}$ will not significantly affect the performance of the circuit and can be neglected when the input power is less than 0 dBm. From the equations (3), the corresponding measurable capacitance $C_{bc}$ and the nonlinear current source $i_{NLCBC}$ can be obtained simply by differentiating the charge equation with respect to $v_{be}$ and time, respectively, as follows:

$$C_{BC}(v_{be}) = C_{BC} + 2K_{2CBC} v_{be} + 3K_{3CBC} v_{be}^2$$

$$i_{NLCBC} = jw(C_{BC} v_{be} + K_{2CBC} v_{be}^2 + K_{3CBC} v_{be}^3) \tag{4}$$

Here, $\omega$ is simply the frequency of the distortion tone. Thus, capacitances do not cause dc distortion currents but contribute most significantly at the harmonic frequencies.

Figure 4A:
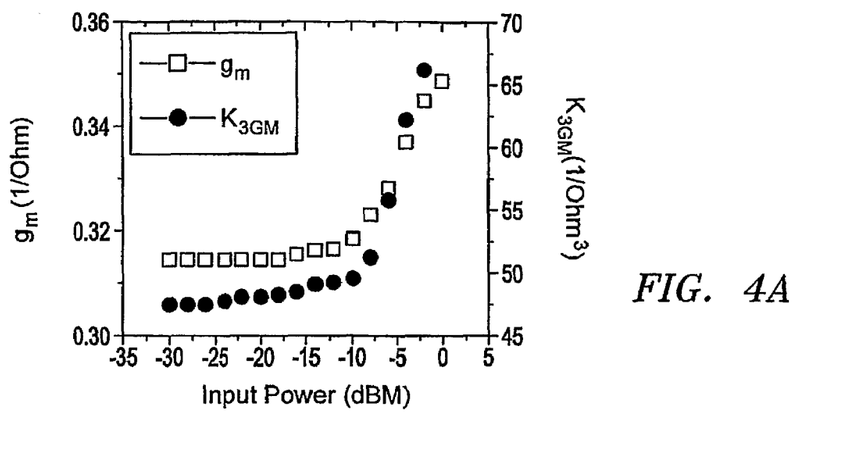
FIGS. 4A-C are graphs depicting exemplary diagrams of the nonlinear coefficients for the first stage of a multiple stage power amplifier section.
Figure 4B:
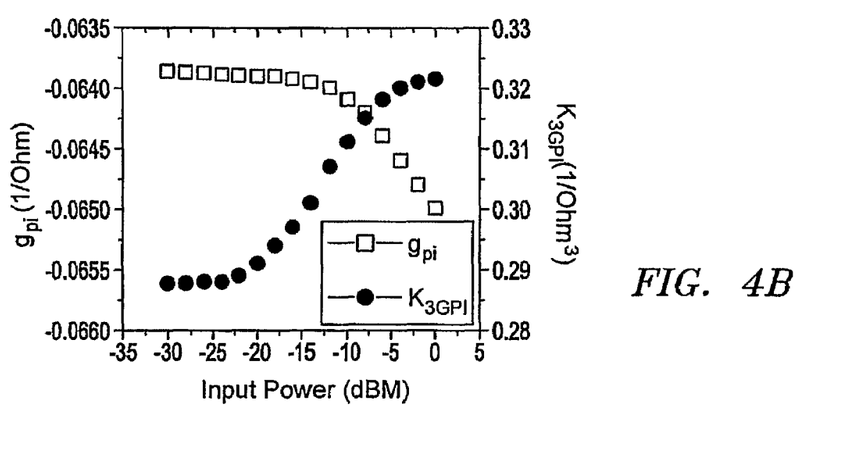
Figure 4C:
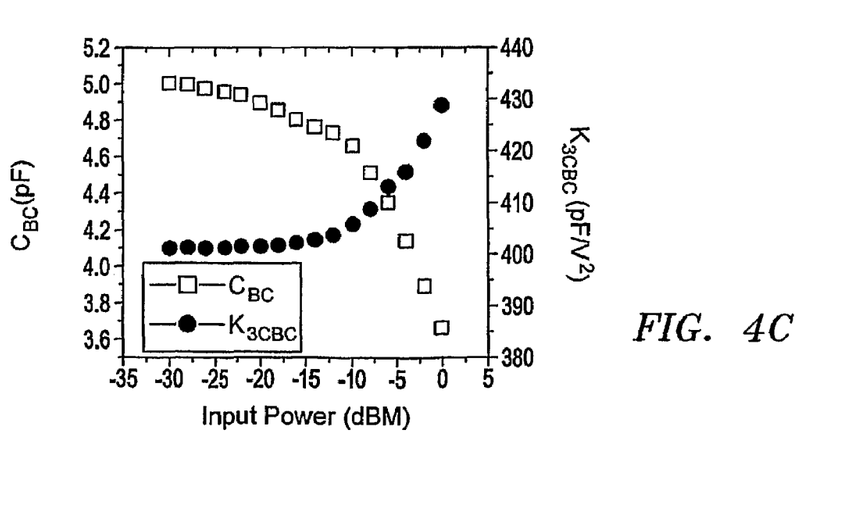

FIGS. 4A-C are graphs depicting exemplary values of the nonlinear coefficients for input power ranging from −30 to 0 dBm. Specifically, FIG. 4A depicts $g_m$ and $K_{3GM}$, FIG. 4B depicts $G_{PI}$ and $K_{3GPI}$, and FIG. 4C depicts $C_{BC}$ and $K_{3CBC}$.

The first and third order nonlinear coefficients generate the majority of the nonlinear effect, therefore the second order coefficients are not included in FIGS. 4A-C. As the input power increases to a high level, the equivalent DC biasing point of TI is pushed from a weak saturation mode to the forward active mode, i.e. a higher $V_{CE}$ and smaller $I_C$. Therefore, the transconductance of T1 generally increases with increasing input power, as depicted in FIG. 4A. This is different from the traditional biasing condition used in power amplifier design, which has an inverse trend in transconductance as the device operates in the cutoff or saturation region. This new trasnconductance performance increases the power gain at high input power level, and will be discussed in more detail below. Moreover, the $C_{BC}$ of T1 generally decreases with increasing input power for the same or similar reasons, as depicted in FIG. 4C. When T1 operates in the forward active mode, the BC junction has a relatively greater reverse bias than in the saturation mode, resulting in a decrease in the equivalent $C_{BC}$. This can improve the power gain as well. The power gain generally has only a weak dependence on the input conductance.

With the Volterra-series, the nonlinear transfer function can be derived using the method of nonlinear currents, such as that described in S. A. Maas, "Nonlinear Microwave Circuits," Norwood, MA: Artech House, 1988 and P. Wambacq, W. Sansen, "Distortion analysis of Analog Integrated Circuits," Norwell, MA: Kluwer, 1998, both of which are fully incorporated by reference herein. The input and output power is given by:

$$P_{IN} = \frac{|v_{IN}^2|}{2|Z_{IN}|} \tag{5}$$

$$P_{OUT} = \frac{|v_C^2|}{2|Z_L|}$$

The expression for power gain of the amplifier is:

$$G_P \cong \frac{4 Z_S Z_L}{\omega^2 \left(L_e + \frac{Z_S}{\omega_T} + Z_S C'_{bc} Z_L\right)^2 + \omega^4 L_e^2 C'^2_{bc} Z_S^2} \tag{6}$$

$$C'_{bc} = \frac{(C_{bc} + C_f) + R_f^2 C_f^2 C_{bc} \omega^2}{1 + R_f^2 C_f^2 \omega^2}$$

where the $L_e$ is the parasitic inductance from emitter to ground and $\omega_T$ is the unity current gain radian frequency, which is proportional to the equivalent $g_m$. $R_f$ and $C_f$ are the magnitudes of resistor R1 and capacitor C2 in the feedback network. It should be noted that the power gain can be highly sensitive to the variation of $g_m$ and $C_{bc}$. Moreover, as the initial biasing condition changes, the values of the nonlinear coefficients depicted in FIGS. 4A-C will be altered accordingly and the power gain will be affected via equation (6). Consequently, the gain expansion can depend on the initial biasing point of transistor T1. Since both the power gain (from equation (6)) and the gain expansion (from the coefficient's variations with the input power level) depend on the initial biasing condition of T1, a trade-off exists between the two and is depicted in the exemplary graph of FIG. 5. It should be noted that more power gain and less gain expansion can be achieved in PA input stage 202-1 by biasing transistor T1 closer to the forward active mode.

Figure 5:
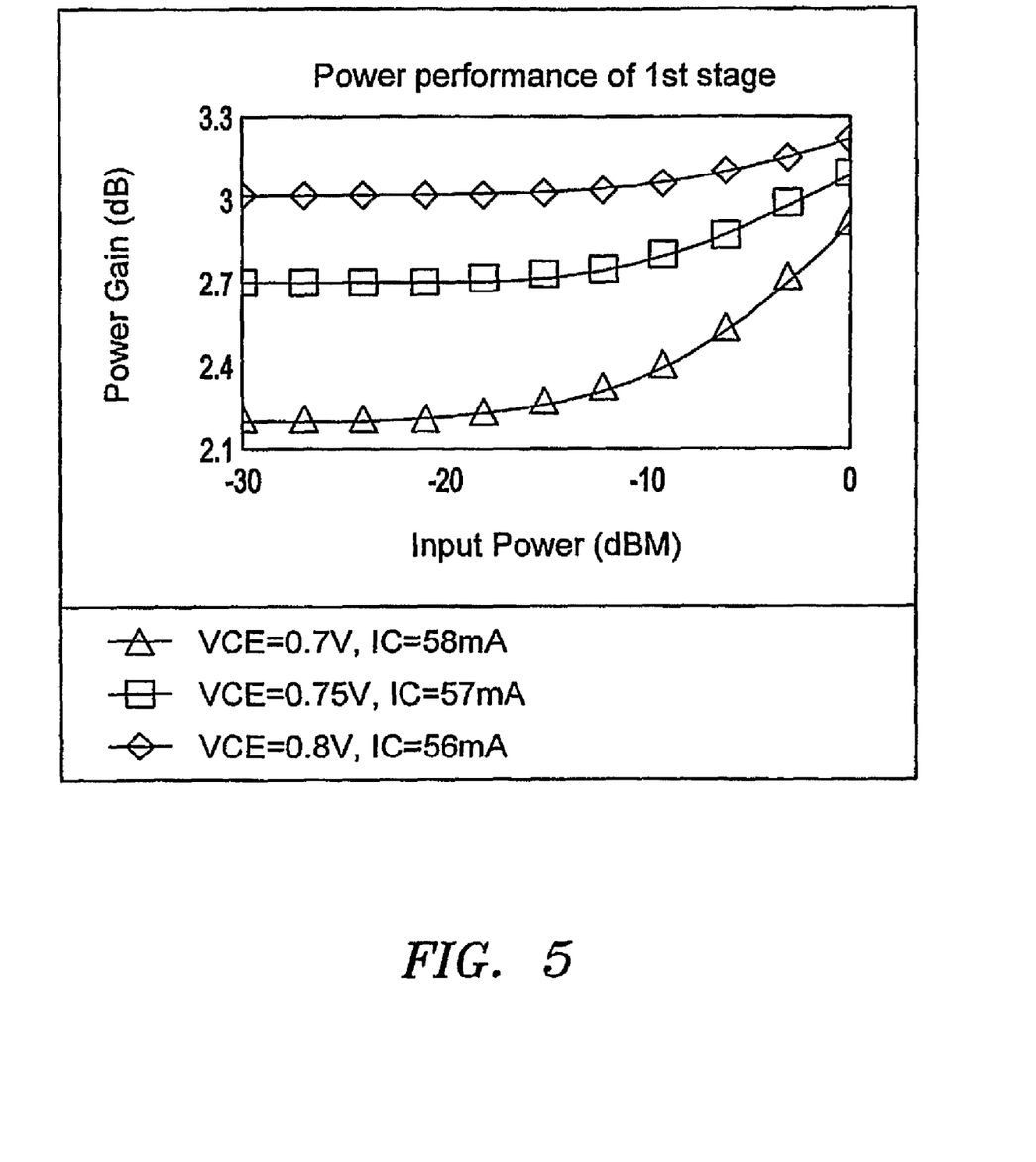
FIG. 5 is a graph depicting an exemplary power performance of the first stage of a multiple stage power amplifier device.

Active device T1 is preferably biased in the area of the border between the active region and the saturation region, referred to herein as the "saturation line." Device T1 can be biased in either the active mode or the saturation mode depending on how much pre-distortion generation is desired in the application. When device T1 is biased in the area of the border between the active and saturation regions such that the desired amount of pre-distortion is achieved, but not necessarily along the saturation line, the device T1 is referred to herein as being biased "substantially along the saturation line."

As the input power increases, the input impedance of PA input stage 202-1 will vary as a result of the self-biasing effect. With the shunt and series feedback topology used in the embodiment described with respect to FIG. 2B, the input impedance under different power levels generally remains unchanged. For input and interstage matching circuits, such as capacitor C1 and interstage matching circuits 203-1 and 203-2, low-pass filter or high-pass filter configurations are preferably used to facilitate broadband performance, although transformers such as those used in conventional designs can also be used.

The reactive elements are preferably used to lower the power insertion loss, although the lossy-matching technique generally used in conventional broadband amplifiers can also be used. It should be noted that the frequency response of matching circuits 203-1 and 203-2 is preferably configured to complement that of the active devices, (e.g., T1, T2, etc.), leading to further gain flatness over a broad frequency range. This technique is referred to as the compensating matching technique. For output stage 202-3 of the embodiment described with respect to FIG. 2B, the layout of T3 and interstage matching network 202-3 can be realized in a distributed fashion, suitable for broadband matching, evenly distributing RF power and stabilizing the DC biasing condition.

Figure 6:
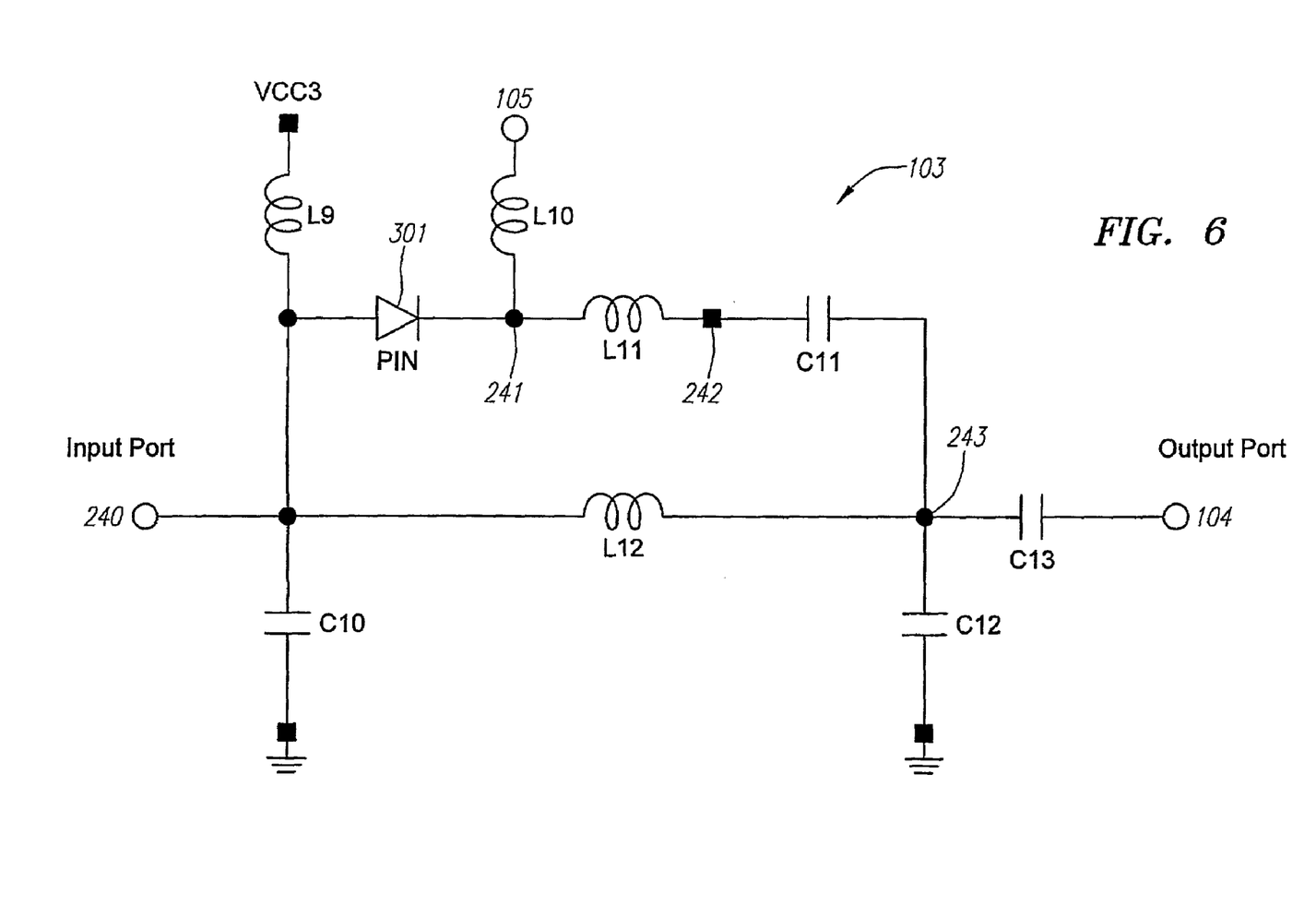
FIG. 6 is a schematic diagram depicting an exemplary embodiment of an output matching network section.

FIG. 6 is a schematic view depicting an exemplary embodiment of output matching network section 103 having one control input 105. Output matching network section 103 is preferably configured as a low pass or a high pass filter. The output impedance of multi-stage PA section 102 is generally much lower than 50 Ohm. Output matching network section 103 has an input node 240, which is preferably coupled to output node 201 of PA section 102. In this embodiment, output matching network section 103 includes four inductors L9-L12, four capacitors C10-C13, and a switch 301. Here, inductor L9 is coupled between input node 240 and one of the DC power supplies, preferably VCC3. Switch 301 is coupled between input node 240 and a first intermediate node 241. Control input port 105 is coupled to intermediate node 241 through inductor L10. Inductor L11 is coupled between first intermediate node 241 and a second intermediate node 242 and capacitor C11 is coupled between second intermediate node 242 and a third intermediate node 243 (i.e., in series with inductor L11). Capacitor C10 is coupled between node 240 and ground, capacitor C12 is coupled between node 243 and ground, and inductor L12 is coupled between nodes 240 and 243. Capacitor C13 is coupled between node 243 and output node 104.

To optimize the power transfer, the component values within output matching network section 103 are selected to satisfy the impedance transformation ratio requirement at the various desired operating frequencies, i.e., to match the output impedance of multi-stage PA secion 102 at the various frequencies. Preferably, PA device 100 is configured so that the operating frequency or operating frequency range is selectable from a larger range of frequencies or frequency ranges. In the embodiment of FIG. 6, control input 105 can be used to receive a frequency selection signal to select one of two different operating frequencies/frequency ranges, for instance, based on the level at the frequency selection signal (e.g., a one or a zero). Additional control inputs 105 can be used to select among a larger number of capable operating frequencies/frequency ranges. For instance, using a binary selection scheme, two inputs 105 would allow for the selection of one of four different bands, three inputs 105 would allow for the selection of one of eight different bands and so forth. Other selection methodologies can also be used, including selection from among more than two ranges with one control input 105.

In the embodiment depicted in FIG. 6, output matching network section 103 is configured as a $\pi$-match, low pass filter network. This $\pi$-match configuration decouples the Q requirement from the transformation ratio by introducing an intermediate resistance value to transform to, providing the ability to achieve a relatively much higher Q than that which is generally available from a simple L-match. The values of C10, C12 and L12 generally determine the resonate frequency, Q value and the impedance transform ratio.

The values of the capacitors in the output matching circuit can be pre-selected for a specific application. To provide adjustable inductance, switch 301 is used. Switch 301 is preferably a PIN diode, although any types of switch or switch-like device can be used. Here, PIN diode 301 is used to control the equivalent inductance between C10 and C12, consequently changing the resonate frequency and the impedance transformation ratio. Placement of PIN diode 301 in one branch of output matching network section 301 means that only part of the signal passes through PIN diode 301, resulting in less power insertion loss and degradation in linearity. It should be noted that because the Q value of L11 is relatively much lower than that of PIN diode 301 and C11 (a by-pass capacitor), the equivalent Q value of this branch is mainly determined by L11. The additional power consumed by PIN diode 301 is generally only a relatively minor amount of the total DC power consumption of PA device 100 (e.g., approximately 0.2%).

When PIN diode 301 is switched off, the equivalent inductance of L12 is relatively large and the resonate frequency is tuned to a first frequency. When PIN diode 301 is switched on, the equivalent inductance of L12 is relatively small and the resonate frequency is tuned to a different frequency. For further information, see H. Zhang, H. Gao, G. Li, "A Novel Tunable Broadband Power Amplifier Module Operating from 0.8 GHz to 2.0 GHz," IEEE MTT-S 2005 International Microwave Symposium, pp. 661-664H, and H. Zhang, H. Gao, G. Li, "A Novel Tunable Broadband Power Amplifier Module Operating from 0.8 GHz to 2.0 GHz," IEEE Transactions on MTT, November 2005, pp. 3606-3614, both of which are fully incorporated by reference herein.

Figure 7A:
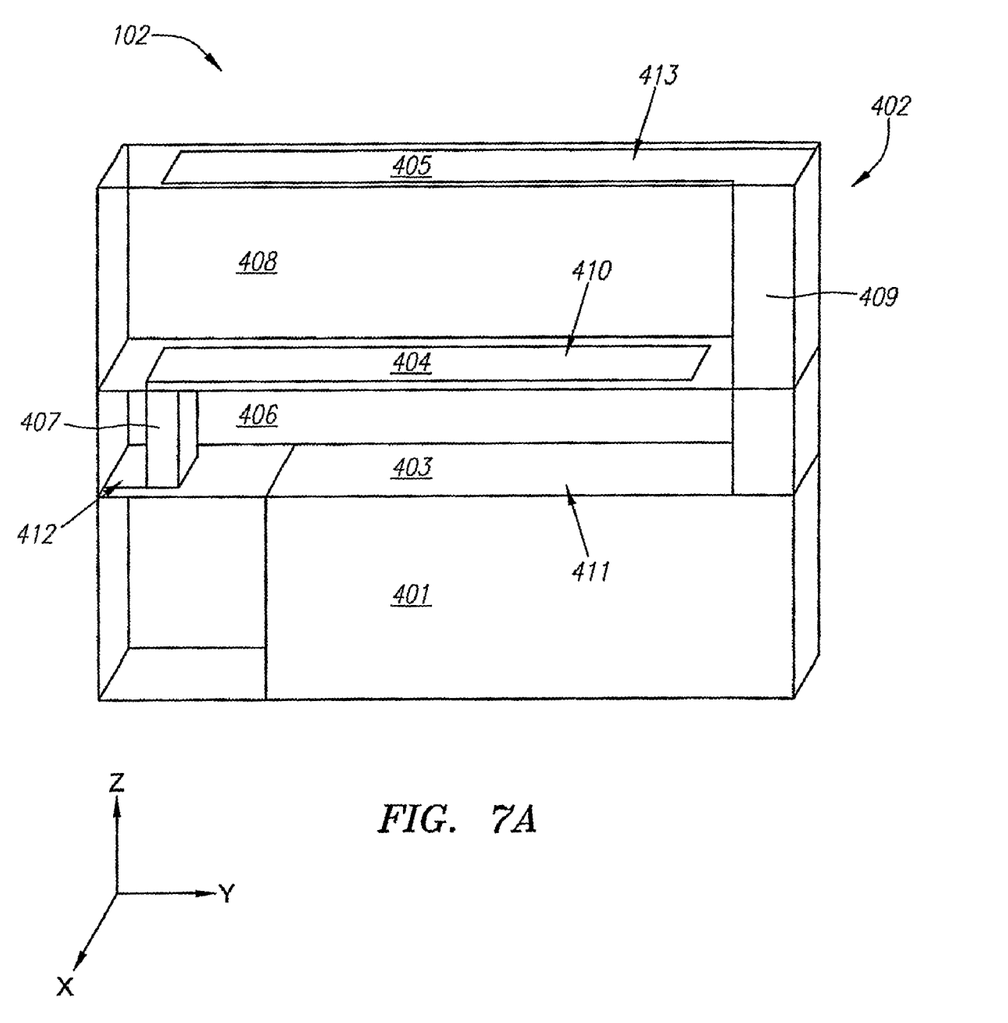
FIG. 7A is a cross-sectional view depicting a portion of an exemplary active device having a distributed capacitor.

FIG. 7A is a cross-sectional view depicting an exemplary embodiment of a portion of active device T1 as fabricated within and over a semiconductor substrate 401. Here, an interdigital capacitor 402 is formed between three conductive layers 403-405 on substrate 401. Specifically, a first conductive layer 403 is formed over a portion of substrate 401, which can be coupled with ground and used to form a ground node. A conductive trace 411, or finger, is formed in conductive layer 403 and is used to form a lower portion of a first plate of interdigital capacitor 402. An interlevel dielectric layer 406 is formed over conductive layer 403, on which a second conductive layer 404 is formed. A conductive trace 410 (finger) is patterned in conductive layer 404 to form a second, central plate of interdigital capacitor 402.

Conductive layer 404 is connected to emitter node 213 of active device T1 by way of via 407 and one or more additional conductive traces, including a trace 412 formed in conductive layer 403. A second interlevel dielectric layer 408 is formed over conductive layer 404. A third conductive layer 405 is then formed over interlevel dielectric layer 408 and patterned to form a conductive trace 413 (finger), which forms an upper portion of the first plate of capacitor 402. Trace 413 is connected to trace 411 by way of via 409, located in dielectric layers 406 and 408. The capacitance of capacitor 402 can be adjusted by adjusting the degree to which trace 410 overlaps trace 411 (overlapping in the X and/or Y directions), the degree to which trace 413 overlaps trace 410, the thickness (Z direction) of dielectric layers 406 and 408, as well as the dielectric constant of layers 406 and 408, to name a few.

It should be noted that interdigital capacitor 402 is not limited to the configuration described with respect to FIG. 7A. Additional overlapping traces can be included to further adjust the capacitance of capacitor 402. For instance, if additional dielectric and conductive layers are formed over layer 405, then additional traces can be formed in those conductive layers and used to form additional "fingers" of interdigital capacitor 402.

Figure 7B:
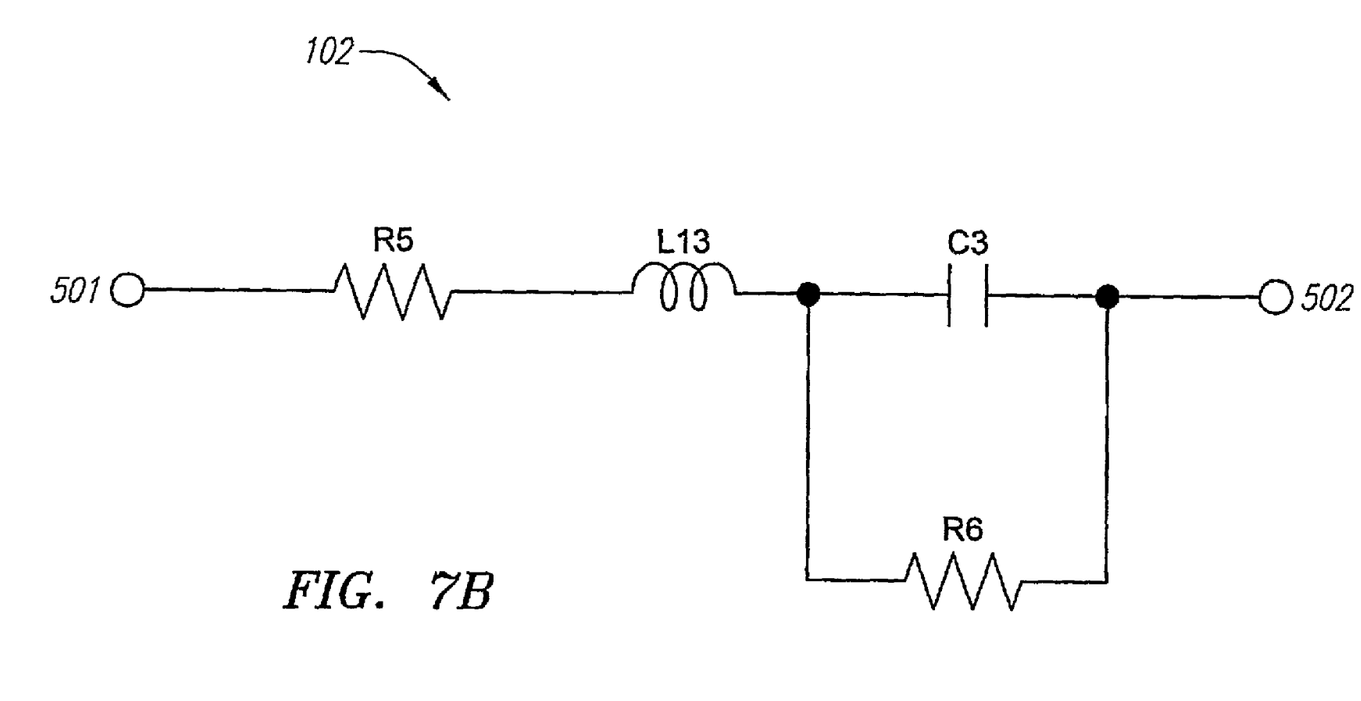
FIG. 7B is a schematic view depicting an exemplary equivalent circuit for the structure depicted in FIG. 7A.

FIG. 7B is a schematic diagram depicting an equivalent circuit for the embodiment described with respect to FIG. 7A. Located between nodes 501 and 502, the equivalent circuit includes a resistor R5 in series with an inductor L13, which is in series with a parallel combination of resistor R6 and capacitor C3. Capacitor C3 is the same as capacitor 402 of FIG. 7A. It should be noted that capacitor C3 is the by-pass capacitor in stage 202-1 of FIG. 2B. However, the structure described with respect to FIG. 7A can also be used to form capacitor C6 in stage 202-2 or capacitor C9 in stage 202-3, or any other capacitor coupled with an active device as used in the implementation.

In FIG. 7B, as mentioned above, capacitor C3 is equivalent to capacitor 402 and formed mainly by the capacitance between trace 410 and the combination of traces 411 and 413. Resistor R6 is formed mainly by the resistance between these same traces 410 and 411/413 and is generally on the order of one megaohm. Resistor R5 is formed mainly by the parasitic resistance of traces 410-413 as well as the parasitic resistance of vias 407 and 409. Inductor L13 is also formed mainly by the inductance of traces 410-413 as well as the inductance of vias 407 and 409. It should be noted that emitter ballasting resistors R2-R4 of FIG. 2B are not depicted in FIG. 7A. The structure of FIG. 7A can generally be used to decrease the surface area consumed by the capacitors in multi-stage PA section 102.

It should be noted that the discrete components (e.g., resistors, capacitors, inductors and the like) described and depicted herein are not required to be implemented as individually recognizable discrete components, but can in fact be implemented in any manner as elements displaying the respective property (e.g., resistive elements, capacitive elements, inductive elements and the like). For instance, a resistor can be implemented by a resistive element which can be any element that resists current, including a conductive trace within the MMIC or on the PCB, a portion of a semiconductor substrate, a ceramic discrete resistor implemented on a PCB, and the like. Likewise, a capacitor can be implemented by any element that allows current to flow through it when some time-varying voltage is applied across it, and an inductor can be implemented by any element that exhibits a voltage across it when the current passing through it is varying in time.

While the invention is susceptible to various modifications, and alternative forms, specific examples thereof have been shown in the drawings and are herein described in detail. It should be understood, however, that the invention is not to be limited to the particular forms or methods disclosed, but to the contrary, the invention is to cover all modifications, equivalents and alternatives falling within the spirit and scope of this disclosure.

What is claimed is:

1. A power amplifier device configured for broadband operation, comprising:
   (a) a multiple stage power amplifier section comprising an input stage coupled with one or more subsequent stages, wherein one of the one or more subsequent stages being an output stage, and wherein the input stage and the one or more subsequent stages amplify an input signal to form an output signal, the input stage comprising:
      (i) a transistor having a base node, a collector node and an emitter node;
      (ii) a first feedback path coupled with the emitter node;
      (iii) a second feedback path coupled between the base node and the collector node, the second feedback path comprising a resistive element and a capacitive element; and
      (iv) an input node coupled with the base node, the input node for receiving an input signal to the multiple stage power amplifier, wherein the collector node is coupled with a subsequent stage of the power amplifier; and
   (b) an output matching network section coupled with the output stage of the power amplifier, wherein the one or more subsequent stages comprises a first subsequent stage coupled to the input stage, and a second subsequent stage coupled to the first subsequent stage, wherein the second subsequent stage is the output stage.

2. The power amplifier device of claim 1, wherein the input stage is coupled directly to the output stage.

3. The power amplifier device of claim 1, wherein the first feedback path comprises an inductive element.

4. The power amplifier device of claim 1, wherein the first feedback path comprises a capacitive element in parallel with a resistive element.

5. The power amplifier device of claim 4, wherein the first feedback path comprises:
   (a) an interdigital capacitor comprising:
      (i) a first plate having an upper portion and a lower portion; and
      (ii) a second plate located between the upper portion and lower portion of the first plate.

6. A power amplifier device configured for broadband operation, comprising:
   (a) a multiple stage power amplifier section comprising an input stage coupled with one or more subsequent stages, wherein one of the one or more subsequent stages being an output stage, the input stage comprising:
      (i) a transistor having a base node, a collector node and an emitter node;

(ii) a first feedback path coupled with the emitter node, wherein the first feedback path comprises:
(1) a capacitive element in parallel with a resistive element;
(2) an interdigital capacitor comprising:
(A) a first plate having an upper portion and a lower portion; and
(B) a second plate located between the upper portion and lower portion of the first plate, wherein the lower portion of the first plate is located in a first conductive layer of the power amplifier device, the second plate is located in a second conductive layer of the power amplifier device overlying the first conductive layer, and the upper portion of the first plate is located in a third conductive layer of the power amplifier device overlying the second conductive layer;
(iii) a second feedback path coupled between the base node and the collector node, the second feedback path comprising a resistive element and a capacitive element; and
(iv) an input node coupled with the base node, the input node for receiving an input signal to the multiple stage power amplifier, wherein the collector node is coupled with a subsequent stage of the power amplifier; and
(b) an output matching network section coupled with the output stage of the power amplifier.

7. The power amplifier device of claim 1, wherein the collector node is coupled to a power supply by way of an inductive element and a resistive load element.

8. A power amplifier device configured for broadband operation, comprising:
(a) a multiple stage power amplifier section comprising an input stage coupled with one or more subsequent stages, wherein one of the one or more subsequent stages being an output stage, and wherein the input stage and the one or more subsequent stages amplify an input signal to form an output signal, the input stage comprising:
i) a transistor having a base node, a collector node and an emitter node;
(ii) a first feedback path coupled with the emitter node;
(iii) a second feedback path coupled between the base node and the collector node, the second feedback path comprising a resistive element and a capacitive element; and
(iv) an input node coupled with the base node, the input node for receiving an input signal to the multiple stage power amplifier, wherein the collector node is coupled with a subsequent stage of the power amplifier;
(b) an output matching network section coupled with the output stage of the power amplifier; and
(c) an interstage matching circuit coupled between at least two adjacent stages of the multiple stage power amplifier section, wherein the matching circuits have frequency responses configured to complement that of the input stage or the one or more subsequent stages.

9. The power amplifier device of claim 8, wherein the interstage matching circuit is configured as one of a low pass filter or a high pass filter.

10. The power amplifier device of claim 1, wherein the output matching network section is configured as one of a low pass filter or a high pass filter.

11. The power amplifier device of claim 1, configured for selective operation at one frequency range out of a plurality of frequency ranges.

12. A power amplifier device configured for broadband operation, wherein the power amplifier is configured for selective operation at one frequency range out of a plurality of frequency ranges, comprising:
(a) a multiple stage power amplifier section comprising an input stage coupled with one or more subsequent stages, wherein one of the one or more subsequent stages being an output stage, the input stage comprising:
(i) a transistor having a base node, a collector node and an emitter node;
(ii) a first feedback path coupled with the emitter node;
(iii) a second feedback path coupled between the base node and the collector node, the second feedback path comprising a resistive element and a capacitive element; and
(iv) an input node coupled with the base node, the input node for receiving an input signal to the multiple stage power amplifier, wherein the collector node is coupled with a subsequent stage of the power amplifier; and
(b) an output matching network section coupled with the output stage of the power amplifier, wherein the output matching network section comprises a control input configured to receive a frequency range selection signal.

13. The power amplifier device of claim 12, wherein the control input is coupled to a switch controllable by the frequency range selection signal.

14. The power amplifier device of claim 13, wherein the switch is a PIN diode.

* * * * *